United States Patent Office 3,154,446

Patented Oct. 27, 1964

3,154,446

METHOD OF FORMING JUNCTIONS

Morton E. Jones, Richardson, Tex., assignor to Texas Instruments Incorporated, Dallas, Tex., a corporation of Delaware No Drawing. Filed May 2, 1960, Ser. No. 25,869
15 Claims. (Cl. 148—189)

This invention relates to an improved technique for preparing material to be incorporated into semiconductor devices and more particularly it relates to an improved process for forming PN junctions in Group III–V compound semiconductors, such as gallium arsenide and indium antimonide, and to the products resulting from such process.

Semiconductor materials have become increasingly important, as their properties have become better known, for making such items as transistors, diodes and photoelectric and thermoelectric devices among others.

Various elements of Group IV of the Periodic Table of Elements have characteristics requisite for semiconductor materials. (As used herein the Periodic Table of Elements shall mean that table according to Mendelejeff as now generally portrayed.) Of these, germanium and silicon have been widely used for making various semiconductor devices; however, there are certain inherent limitations of germanium and silicon semiconductor materials, as hereinafter noted, which prevent their fabrication into devices with optimum characteristics.

Various characteristics of semiconductor materials affect the characteristics of devices fabricated therefrom. For instance, such things as lifetime of carriers, impurity levels, and carrier mobility all affect the operating characteristics of a device. (These terms have acquired well known definitions which have been published in the Glossary of Terms Frequently Used in Solid State Physics issued by the American Institute of Physics in October 1959.) Since germanium and silicon devices, because of some of their limitations with respect to the aforementioned properties, are not useful except below certain temperatures and certain frequencies, investigators have sought new and better semiconductor materials.

Diligent searching by various experimenters and investigators uncovered the ability of certain crystalline compounds containing at least two elements to exhibit semiconductor properties. These compounds are now commonly referred to as compound semiconductors. A compound semiconductor can be formed from an element selected from Group III and an element selected from Group V of the Periodic Table of Elements. These compound semiconductors have previously been disclosed in U.S. Patent Number 2,798,989 to Welker, and because some of these compound semiconductors appear superior in many respects to the Group IV elemental semiconductor materials, such as germanium and silicon, much effort has been expended to fabricate devices from these compound semiconductors to take advantage of their inherent properties. Gallium arsenide and indium antimonide are such compound semiconductor materials.

The electron or "carrier" mobility in a semiconductor material is a major factor affecting the frequency response of any device fabricated therefrom and the energy gap of a semiconductor material is a major factor affecting the operating temperature at which devices fabricated therefrom may be utilized. The several compound semiconductor materials offer a wide choice in the selection and combination of these and other factors and thus device characteristics can be optimized for a particular function by proper selection of the semiconductor material used in making the device. For instance, silicon and germanium semiconductors have energy gaps of 1.1 and 0.75 electron volts, respectively. Therefore devices made from these semiconductor materials are limited in operation to temperatures of 85° C. for germanium and 150° C. for silicon. However, gallium arsenide, a compound semiconductor, has an energy gap of about 1.35 electron volts, and can be operated up to temperatures around 400° C. Furthermore, the electron mobility of gallium arsenide is substantially greater than either germanium or silicon and therefore devices from this material can be operated at extremely high frequencies. Thus gallium arsenide has the properties necessary to optimize the design of certain semiconductor devices.

To fabricate useful devices from semiconductor materials it is necessary first to obtain high purity material which exhibits semiconductor properties and then by various processes of diffusing, alloying and growing to introduce conductivity-affecting donor or acceptor impurities into the crystalline lattice of the semiconductor material. The techniques for achieving desired impurity levels in germanium and silicon semiconductor materials have become fairly well established. For instance, the process for controlled diffusion of impurities into germanium and silicon is well known, and it is relatively easy to control the surface concentration of impurities diffused into single element semiconductor materials.

Controlling the surface concentration impurities in semiconductors is important because of the effect such impurities have on the operating characteristics of transistors and diodes fabricated therefrom. As an example, the emitter efficiency of a transistor is characterized by various factors including the emitter-to-base resistivity ratio. In other words, emitter efficiency is proportional to the ratio of the average impurity concentration in the emitter region to the average impurity concentration in the base region. Surface concentration of impurities in a region, such as the base of a transistor, affects the over-all average impurity concentration. Therefore, it is desirable to diffuse base regions into transistors at controlled surface concentrations, because as the surface concentration exhibited by an impurity increases, the over-all average bulk resistivity increases.

In a transistor, if the surface concentration of impurity in the base region approaches the maximum impurity concentration in the emitter region, leakage current will be increased at the surface, and the over-all current gain will be decreased. By controlling the surface concentration of impurities in the diffused base of the transistor, a lower average impurity concentration with respect to the emitter impurity concentration can be achieved with the resulting higher majority carrier mobility and higher carrier lifetime. Since a higher carrier lifetime is achieved, the base transport efficiency will be increased with an attendant higher over-all current gain in the device.

Further, in the diffused base transistor, the width of the base region is often desirably thin—in some devices a few microns. Thus, the high surface concentration region, in effect, may constitute almost the entire junction. In this situation the average impurity concentration approaches the surface concentration of the region. Therefore in these thin base regions control of surface concentration of impurities is critical in making high emitter efficient transistors.

In photodiode devices, a high surface concentration of impurities produces a relatively high voltage output but undesirably low conduction currents. By controlling the surface concentration of the diffused impurity an optimum compromise for a given application of the device may be achieved.

It is necessary in the manufacture of semiconductor devices to distribute impurities into the semiconductor exhibiting one type of conductivity such that a region of an opposite type conductivity can be obtained at a predictable depth. This can best be accomplished in diffusion runs by controlling the solubility limit of impurities in the semiconductor and the time of the diffusion run. As previously mentioned, in silicon and germanium it is relatively easy to control the surface concentration of impurities by controlling the solubility limit. The technique most often used is to insert the semiconductor material in one end and the diffusant in the other end of a closed reaction vessel. The vessel is placed in a two-temperature zone furnace so that the semiconductor can be maintained at the required temperature for the impurities to diffuse therein while maintaining the diffusant source at a lower temperature which will give a vapor pressure necessary to achieve the desired solubility limit, hence the desired surface concentration of the diffusant in the semiconductor. The surface concentration in such a system can be varied by varying the vapor pressure through means of changing the temperature at which the diffusant source is maintained.

One disadvantage of two-temperature zone diffusion is that the equipment necessary to maintain two-temperature zones is much more complicated and expensive than the simple one-temperature zone necessary in the present invention.

Despite inherent advantages of gallium arsenide and other compound semiconductors, certain difficulties not present in fabricating devices of single element semiconductor material have prevented fabrication of compound semiconductor devices to any important degree, presently. Among these are the difficulties of producing a material of the requisite purity, and the difficulties of adding required amounts of significant impurities or dopes in a controlled manner to the pure material to produce the P- and N-type regions required in useful devices.

Particularly in the case of gallium arsenide and other compound semiconductors, the diffusion technique is complicated because most compound semiconductors have one element that is relatively volatile at the diffusion temperature and has a tendency to volatilize thereby degrading the compound semiconductor. Further, it is not possible to maintain the impurity source at a temperature lower than the diffusion temperature of the compound semiconductor because some of the volatile component of the semiconductor vaporizing at the diffusion temperature would condense on the cooler surface; hence, the compound semi-conductor would be degraded to a degree sufficient to prevent the later fabrication of operable devices. In compound semiconductors the vapor pressure of a conductivity-affecting impurity is usually too high at the desired diffusion temperature to provide any reasonable degree of control over the impurity concentration or level; hence, undesirably high surface concentrations result.

In the prior art, to avert high surface concentrations, compound semiconductors have been alloyed with an impurity and powdered, and then used as an impurity vapor source for diffusing into the compound semiconductor. By this technique the vapor pressure exhibited by the ambient atmosphere of the impurity was controlled by varying the amount of impurity alloyed with the powdered compound semiconductor.

The solid source diffusion is a relatively successful method; however, there are various difficulties present which preclude optimum control of impurity levels and the attendant surface concentrations. In using a solid source to obtain an impurity vapor it is necessary that the impurities first out-diffuse from the solid or powdered compound semiconductor, thereby forming the impurity atmosphere. At low temperatures substantial time is required to sufficiently out-diffuse the impurities from the powdered compound semiconductor because the diffusion coefficients are low. Of course, the larger the particle size of the powdered compound semiconductor, the longer period of time required to out-diffuse the impurities; hence, to obtain substantially uniform results, it is necessary to control the fineness of the powdered impurity source. Moreover, to obtain more rapid out-diffusion of the impurities in the powdered compound semiconductor, it is necessary to increase the temperature above the minimum diffusion temperature which increases degradation of the compound semiconductor substantially as the melting point is approached because of the increased vaporization of the more volatile element of the compound semiconductor.

The present invention circumvents the problems involved in diffusing impurities into compound semiconductors by taking advantage of the well known principle expressed by Raoult's Law, which says: "The vapor pressure of a solute over a mixture is directly proportional to the mole fraction (or atomic percent) of the solute in the solvent." In this invention gallium, indium or aluminum is used as the solvent and the solute is the desired diffusant.

Knowing the fact that Raoult's Law is applicable it is possible to write an equation for the relation between surface concentration of an impurity in a compound semiconductor and its partial vapor pressure above the compound semiconductor which is, $$C_0=\frac{KP}{T^{1/2}} \qquad (1)$$

where $C_0$ is the surface concentration in atoms per centimeter cubed, P is the partial vapor pressure of the solute over the solvent (which is the same as over the compound semiconductor) in millimeters of Hg, T is the temperature of the mixture in degrees Kelvin, and K is an empirical constant which must be determined for each compound semiconductor and diffusant used.

Briefly, the empirical value of K is determined by forming an alloy or mixture of gallium, indium or aluminum with the diffusant desired, according to the teaching of Raoult's Law, so that the partial vapor pressure of the diffusant at some selected diffusion temperature is below a value at which the surface concentration of impurity in the compound semiconductor will equal the solubility limit of that impurity. (In this initial determination of K, it will be necessary to estimate the vapor pressure; however, 10 to 20 atomic percent of the impurity will usually result in a vapor pressure sufficient to determine the value of K within the limits of accuracy required for Equation 1.) This alloy is then placed in one area of a closed reaction vessel with the compound semiconductor to be diffused placed in another area of the vessel. The vessel is then evacuated and sealed, and further heated to the preselected diffusing temperature and the diffusion process allowed to occur for a sufficient period of time to establish an equilibrium between the surface concentration of impurity in the compound semiconductor and the impurity forming the ambient atmosphere at its vapor pressure in the reaction vessel. This requires about twenty minutes to one hour. After the reaction is completed the compound semiconductor is removed and the surface concentration, $C_0$, is determined by any suitable method. One technique which could be used in determining the surface concentration, $C_0$, is the radioactive tracer technique. In this method the impurity is made radioactive and the compound semiconductor after diffusion is examined with a counter to determine the number of impurity atoms present at various depths throughout the compound semiconductor. Once the number of impurity atoms has been determined at each particular depth, $C_0$ has been determined, and the values of T, P, and $C_0$ are then substituted in the equation enumerated above and solved for K. It should be appreciated that other techniques for determining K of Equation 1 are possible; however, once the value of K has been determined the surface concentration can be closely controlled by forming the proper alloy of impurity and indium, gallium or aluminum to exhibit the desired partial vapor pressure in the diffusion process. It may be in some extreme cases that Raoult's Law will not hold true for the alloys consisting of indium or gallium with an impurity. Under these conditions it would be necessary to empirically determine the vapor pressure exhibited by the alloy by making up a series of alloys and plotting their composition versus vapor pressure at the desired diffusion temperature.

Once the determination of K for a particular compound semiconductor and a particular diffusant has been made, it is possible to closely select the desired surface concentration. For instance, once the desired surface concentration (usually this is selected as $10^{16}$, $10^{17}$, $10^{18}$ or $10^{19}$ but may be anything below the solubility limit in the compound semiconductor) has been selected and the desired temperature of the process has been selected, P is determined for the Equation 1. Knowing the pressure, P, necessary to give the proper surface concentration, $C_0$, the amount of impurity necessary to give such a vapor pressure can be determined. This is accomplished by first determining what vapor pressure the impurity element exhibits at the selected operating temperature which can be obtained from a temperature-vapor pressure chart of the impurity element. Such a chart is well known in the art. Having determined the vapor pressure that the impurity element exhibits at the operating temperature desired, it is possible to apply Raoult's Law to determine the atomic percent of the impurity necessary to alloy with the indium, gallium or aluminum to exhibit the calculated vapor pressure of Equation 1 above. Thus, by the technique propounded hereinbefore it is possible to select various desirable surface concentrations of impurities and produce the selected surface concentration in a compound semiconductor.

Furthermore, since the time is not a critical factor for maintaining an equilibrium between the impurity surface concentration and the vapor pressure of the impurity in the ambient atmosphere, it is possible to closely control the junction depth and the diffusion rate by varying the time of the diffusion operation. This is accomplished without affecting the predetermined impurity surface concentration.

From the description delineated above it is obvious that various types of PN junctions may be obtained which are designed to have characteristics particularly desirable in photodiodes or solar cells or transistors or whatever type of device is to be made. Furthermore, the process is adaptable to use in forming double-diffused transistors.

One of the primary features of the present invention is the utilization of indium, gallium or aluminum as the solvent, since they become liquids at low temperatures. It is therefore possible to closely control the amount of impurity in the solvent. Moreover, with the solvent being a liquid at the diffusion temperature it is much quicker and easier to out-diffuse all the impurities into the ambient atmosphere necessary to exhibit the proper partial vapor pressure than heretofore possible with a powdered solvent such as a compound semiconductor.

Another feature of the present invention is the ability to maintain diffusion over a long period of time without the surface concentration of impurities exceeding desired limits. Therefore the present invention makes it possible to obtain controlled junction depths and impurity levels.

Another highly desirable feature of the present invention is that gallium and indium are excellent getters which will combine with various undesirable impurities, for example, oxygen; thus, they have a tendency to purify the surface of compound semiconductors.

It is therefore a primary object of this invention to provide a method whereby donor or acceptor materials may be introduced into III–V compound semiconductor materials in amounts subject to very close control by a suitable choice of source materials.

Another object of the invention is to produce doped III–V compound semiconductors in which a donor or acceptor is present in definite and reproducible amounts.

Still another object of the invention is to produce III–V compound semiconductor PN junction elements into which either the donor or acceptor material has been diffused from a source material comprising an alloy or solution of the diffusant or contaminant with either gallium, indium or aluminum.

A further object of the present invention is to provide a method of forming PN junctions in III–V compound semiconductors having controlled surface concentrations of impurities.

Another further object of the present invention is to provide a method of forming PN junctions in III–V compound semiconductor elements at a temperature substantially lower than the melting point of the compound semiconductor, said elements having controlled surface concentrations of impurities.

A still further object of the present invention is to provide a method of introducing critically controlled amounts of impurities into a III–V compound semiconductor in an apparatus maintained at a substantially uniform temperature.

A specific object of the invention is to introduce zinc into gallium arsenide in critically controlled amounts by transfer thereto from a gallium zinc alloy in an apparatus maintained at a substantially uniform temperature.

These and other objects of the invention are accomplished by the procedure described in specific examples which follow hereinafter and which are to be taken as illustrative rather than as limitative.

For purposes of illustration, the invention will be described in detail with specific reference to gallium arsenide as the preferred III–V compound semiconductor and zinc as a specific diffusant, but it is to be understood that the invention is applicable to a number of other combinations of compound semiconductors and diffusants and that the preferred embodiment has been chosen only for the purposes of illustration. Furthermore, it should be recognized that gallium is a specific example of a liquid solvent material utilized as the diffusant or impurity source and that indium or aluminum could be used equally as well as gallium. Preferably, gallium is used with gallium compound semiconductors, indium with indium compound semiconductors and aluminum with aluminum compound semiconductors.

Initially it is necessary to obtain the value of K in Equation 1 for the case of gallium arsenide with zinc as a diffusant. The first step in determining K is to select a temperature at which the diffusion run is to be made, and then determine the vapor pressure of zinc from a chart of vapor pressure versus temperature. Next, by applying Raoult's Law the ratio of zinc to gallium is selected so that the partial vapor pressure exhibited by the zinc is below that pressure which will allow the surface concentration of zinc in gallium arsenide to reach equilibrium with the zinc vapor at the solubility limit of zinc in gallium arsenide. Having selected values for P and T, an alloy of gallium and zinc is made up in accordance with the requirements of Raoult's Law to exhibit the desired partial vapor pressure and this is then placed in a tube containing clean and properly prepared gallium arsenide. The tube is then evacuated and sealed, and then placed into a furnace which will provide the proper temperature previously selected. After a period of time in which the zinc reaches an equilibrium surface concentration, the gallium arsenide is removed and the surface concentration, $C_0$, measured as mentioned hereinbefore. The value of K is then determined from Equation 1. For the examples below K was determined to be $10^{20}$.

*Examples*

A gallium arsenide wafer was subjected to the usual surface preparation such as cleaning or etching to remove various surface impurities and to clean the surface. The wafer was then placed in one end of the quartz ampule and 1.5 milligrams of zinc were placed at a separate location in the ampule. The ampule was evacuated and sealed. The diffusion run was conducted in apparatus similar to that described in U.S. Patent Numbers 2,900,286 and 2,921,905, namely: a sealed quartz ampule with suitable heating means, except the temperature in the ampule was as free from gradients as possible and was maintained at 800° C. for seven and one-half hours. Two additional runs were made exactly the same as the initial run except 1.5 milligrams of an alloy of gallium with different atomic percents of zinc were used as a diffusant source. The results of the three runs are given in the following table.

| Run No. | Source of Diffusant | Vapor Pressure of Impurity in Ampule (mm. Hg) | Surface Concentration $C_0$ (cm.$^{-3}$) |
|---|---|---|---|
| 1 | Zinc metal | 280 | $10^{20}$ |
| 2 | 99% Ga—1% Zn alloy | 3 | $8.7\times10^{18}$ |
| 3 | 99.9% Ga—0.1% Zn alloy | 0.3 | $8.7\times10^{17}$ |

In each run the amount of diffusant present was 1.5 mg.

Instead of zinc, other Group II elements such as cadmium or mercury may be alloyed with gallium and, in the same fashion any of the Group VI elements: sulfur, selenium or tellurium may be compounded with gallium. Moreover, either gallium, indium or aluminum may be used in compounding an impurity source for any compound semiconductor.

The method described hereinbefore has been found to be superior to diffusion wherein the zinc vapor source is GaAs doped with zinc and powdered, not only in the control of impurity surface concentration and impurity levels, but also in cleanliness and reproducibility of the product.

By judicious selection of diffusants and compound semiconductors, it will be apparent that by utilizing the technique above described, a rectifying barrier of a given type may be formed, regardless of whether the compound semiconductor is undoped, or doped to either N- or P-type and that the production of suitable layered devices such as transistors may be achieved. Moreover, this technique is highly useful in forming diffused base-alloyed emitter and double-diffused transistor structures as well as photodiode devices.

In the case of forming solar cells by diffusion techniques with a diffusant that rapidly diffuses into the compound semiconductor it is desirable to control the diffusion rate so that the injunction depth desired can be achieved while maintaining a desirable surface concentration for acceptable solar cell operation. By using the controlled technique described above, excellent solar cells can be fabricated.

It is to be realized that although gallium, indium and aluminum have been disclosed as the preferred materials with which to alloy the diffusant impurity, many other materials may be used with acceptable results. Materials such as tin, lead or others which have melting points below the diffusion temperature to be used and which will not appreciably affect the electrical properties of the compound semiconductor material may be used as the solvent to control the vapor pressure of the diffusant impurity.

It should be appreciated that various modifications will become apparent to those skilled in the art which do not depart from the spirit and scope of the present invention, and therefore this invention is to be limited only by the appended claims.

What is claimed is:

1. The method of diffusing a conductivity-type determining impurity into a Group III–V compound semiconductor material to form a P-N junction therein with an impurity surface concentration in said material which is less than the solid solubility limit of the impurity in said semiconductor material comprising the steps of providing a diffusion source containing said impurity, said diffusion source when heated to a temperature sufficiently high to effect diffusion of said impurity into said semiconductor material comprising a liquid solution of said impurity as the solute and a solvent material selected from the group consisting of aluminum, gallium, and indium, the amount of said solute impurity in the solution being directly proportional to the partial vapor pressure of said impurity over said diffusion source and said solute impurity amount being such as to provide the predetermined partial vapor pressure of said impurity which is required to produce the particular desired surface concentration of said impurity in said semiconductor material at said diffusion temperature; said partial vapor pressure further not exceeding that vapor pressure at which the surface concentration of the impurity diffused into the semiconductor material would equal the solubility limit of said impurity in the semiconductor material; placing said diffusion source and compound semiconductor material within a diffusion chamber; heating both said diffusion source and semiconductor material to said diffusion temperature, and maintaining said temperature for a time sufficient to cause diffusion of said impurity into said semiconductor material to form a P-N junction with said desired impurity surface concentration in said semiconductor material.

2. The method as set forth in claim 1 and wherein said diffusion source comprises an alloy of said impurity and gallium.

3. The method as set forth in claim 1 and wherein said diffusion source comprises an alloy of said impurity and indium.

4. The method as set forth in claim 1 and wherein said diffusion source comprises an alloy of said impurity and aluminum.

5. The method of diffusing a conductivity-type determining impurity comprising zinc into gallium arsenide to form a P-N junction therein with a zinc impurity surface concentration in said material which is less than the solid solubility limit of the zinc impurity in the gallium arsenide comprising the steps of providing a diffusion source containing said impurity, said diffusion source when heated to a temperature sufficiently high to effect diffusion of said impurity into said gallium arsenide comprising a liquid solution of said impurity as the solute and gallium as the solvent material, the amount of said solute impurity in the solution being directly proportional to the partial vapor pressure of said impurity over said diffusion source and said solute impurity amount being such as to provide the predetermined partial vapor pressure of said impurity which is required to produce the particular desired surface concentration of said impurity in said gallium arsenide at said diffusion temperature; said partial vapor pressure further being less than that vapor pressure at which the surface concentration of the impurity diffused into the gallium arsenide would equal the solubility limit of said impurity in the semiconductor material; placing said diffusion source and gallium arsenide within a closed diffusion chamber; heating both said diffusion source and gallium arsenide to said diffusion temperature, and maintaining said temperature for a time sufficient to cause diffusion of said impurity into said gallium arsenide to form a P-N junction with said desired impurity surface concentration in said gallium arsenide.

6. The method of diffusing a conductivity-type determining impurity comprising zinc into indium antimonide to form a P-N junction therein with a zinc impurity surface concentration in said material which is less than the solid solubility limit of the zinc impurity in the indium antimonide comprising the steps of providing a diffusion source containing said impurity, said diffusion source when heated to a temperature sufficiently high to effect diffusion of said impurity into said indium antimonide comprising a liquid solution of said impurity as the solute and indium as the solvent material; the amount of said solute impurity in the solution being directly proportional to the partial vapor pressure of said impurity over said diffusion source and said solute impurity amount being such as to provide the predetermined partial vapor pressure of said impurity which is required to produce the particular desired surface concentration of said impurity in said indium antimonide at said diffusion temperature; said partial vapor pressure further being less than that vapor pressure at which the surface concentration of the impurity diffused into the indium antimonide would equal the solubility limit of said impurity in the semiconductor material; placing said diffusion source and indium antimonide within a closed diffusion chamber; heating both said diffusion source and indium antimonide to said diffusion temperature, and maintaining said temperature for a time sufficient to cause diffusion of said impurity into said indium antimonide to form a P-N junction with said desired impurity surface concentration in said indium antimonide.

7. The method of diffusing a conductivity-type determining impurity comprising cadmium into indium antimonide to form a P-N junction therein with a cadmium impurity surface concentration in said material which is less than the solid solubility limit of the cadmium impurity in the indium antimonide comprising the steps of providing a diffusion source containing said impurity, said diffusion source when heated to a temperature sufficiently high to effect diffusion of said impurity into said indium antimonide comprising a liquid solution of said impurity as the solute and indium as the solvent material, the amount of said solute impurity in the solution being directly proportional to the partial vapor pressure of said impurity over said diffusion source and said solute impurity amount being such as to provide the predetermined partial vapor pressure of said impurity which is required to produce the particular desired surface concentration of said impurity in said indium antimonide at said diffusion temperature; said partial vapor pressure further being less than that vapor pressure at which the surface concentration of the impurity diffused into the indium antimonide would equal the solubility limit of said impurity in the semiconductor material; placing said diffusion source and indium antimonide within a closed diffusion chamber; heating both said diffusion source and indium antimonide to said diffusion temperature, and maintaining said temperature for a time sufficient to cause diffusion of said impurity into said indium antimonide to form a P-N junction with said desired impurity surface concentration in said indium antimonide.

8. The method of diffusing a conductivity-type determining impurity selected from the group consisting of zinc, cadmium, and mercury into a Group III–V compound semiconductor material to form a P–N junction therein at a controlled desired surface concentration of said impurity when heated to a temperature sufficiently high to effect diffusion of said impurity into said semiconductor material comprising the steps of providing a diffusion source, said diffusion source comprising a liquid solution of said impurity as the solute and a solvent material selected from the group consisting of gallium, indium, and aluminum, the amount of said solute impurity in the solution being directly proportional to the partial vapor pressure of said impurity over said diffusion source and said solute impurity amount being such as to provide the predetermined partial vapor pressure of said impurity which is required to produce the particular desired surface concentration of said impurity at said diffusion temperature, said partial vapor pressure further being less than that vapor pressure at which the surface concentration of the impurity diffused into the semiconductor material would equal the solubility limit of said impurity in the semiconductor material; placing said diffusion source and said compound semiconductor element in a closed diffusion chamber; heating both said diffusion source and said compound semiconductor material to said diffusion temperature and maintaining said temperature for time sufficient to establish equilibrium of the surface concentration of said impurity in said semiconductor material at said diffusion temperature and to cause diffusion of said impurity into said semiconductor element to form a P–N junction therein with an impurity surface concentration which is less than the solid solubility limit of the impurity in the semiconductor material.

9. The method of diffusing a Group III–V compound semiconductor element as defined in claim 8 wherein said solute impurity is zinc, said solvent material is gallium, and said compound semiconductor element is of gallium arsenide.

10. The method of diffusing a Group III–V compound semiconductor element as defined in claim 8 wherein said compound semiconductor element is of indium antimonide, said solute impurity is zinc, and said solvent material is indium.

11. The method of diffusing a Group III–V compound semiconductor element as defined in claim 8 wherein said compound semiconductor element is of indium antimonide, said solute impurity is cadmium, and said solvent material is indium.

12. The method of diffusing a conductivity-type determining impurity into a Group III–V compound semiconductor element to form a PN junction therein at a controlled desired surface concentration of said impurity which is less than the solid solubility limit of the impurity in said semiconductor element, comprising the steps of alloying said impurity with a material selected from the group consisting of gallium, indium, and aluminum to provide a diffusion source alloy, the amount of said impurity in said alloy being directly proportional to the vapor pressure of said impurity over said diffusion source and said impurity amount being such as to provide the predetermined partial vapor pressure of said impurity at the diffusion temperature which is required to produce the particular desired surface concentration of said impurity, placing said alloy and said compound semiconductor element in an evacuated diffusion chamber, heating said alloy and said Group III–V compound semiconductor element to said diffusion temperature said alloy being a liquid at said diffusion temperature, and maintaining said temperature for a time sufficient to establish equilibrium of the surface concentration of said impurity element in said Group III–V compound semiconductor element at said diffusion temperature.

13. The method as defined in claim 12 wherein said material is gallium.

14. The method as defined in claim 12 wherein said material is indium.

15. The method as defined in claim 12 wherein said material is aluminum.

References Cited in the file of this patent

UNITED STATES PATENTS

| | | |
|---|---|---|
| 2,836,521 | Longini | May 27, 1958 |
| 2,846,340 | Jenny | Aug. 5, 1958 |
| 2,847,335 | Gremmelmaier et al. | Aug. 12, 1958 |
| 2,854,363 | Seiler | Sept. 30, 1958 |
| 2,870,049 | Mueller et al. | Jan. 29, 1959 |
| 2,900,286 | Goldstein | Aug. 18, 1959 |
| 2,928,761 | Gremmelmaier et al. | Mar. 15, 1960 |
| 2,956,216 | Jenny et al. | Oct. 11, 1960 |

OTHER REFERENCES

Kroemer: "Method of Diffusing Impurities into Semiconductors," RCA TN No. 13, 2 sheets.

Hansen: Constitution of Binary Alloys, 2nd Edition, McGraw-Hill Book Company, New York, 1958, relied on pages 131, 148, 756, 857, 859, 863, 867.